(12) United States Patent
Eldridge et al.

(10) Patent No.: US 7,692,433 B2
(45) Date of Patent: Apr. 6, 2010

(54) SAWING TILE CORNERS ON PROBE CARD SUBSTRATES

(75) Inventors: Benjamin N. Eldridge, Danville, CA (US); Roy J. Henson, Pleasanton, CA (US); Eric D. Hobbs, Livermore, CA (US); Peter B. Mathews, Los Altos, CA (US); Makarand S. Shinde, Livermore, CA (US)

(73) Assignee: FormFactor, Inc., Livermore, CA (US)

( * ) Notice: Subject to any disclaimer, the term of this patent is extended or adjusted under 35 U.S.C. 154(b) by 144 days.

(21) Appl. No.: 11/455,110

(22) Filed: Jun. 16, 2006

(65) Prior Publication Data
US 2007/0290705 A1   Dec. 20, 2007

(51) Int. Cl.
*G01R 31/26*   (2006.01)
(52) U.S. Cl. ............................ 324/754; 324/761
(58) Field of Classification Search ................ None
See application file for complete search history.

(56) References Cited

U.S. PATENT DOCUMENTS 5,070,297 A * 12/1991 Kwon et al. ............... 324/754
5,489,853 A * 2/1996 Nakajima ................... 324/754
5,828,226 A   10/1998 Higgins et al.
6,236,446 B1   5/2001 Izumi et al.
6,597,188 B1 * 7/2003 Reynoso et al. ............ 324/755
6,710,609 B2   3/2004 Mok et al.
2006/0125107 A1   6/2006 Kirby et al.

OTHER PUBLICATIONS

U.S. Appl. No. 10/868,425, filed Dec. 15, 2005, Eldridge, et al.
Tatsuo et al., "A novel probe-card for 8 inch full wafer contact using MLS," Micronics Japan Co., Ltd. (Jun. 5-8, 2005) (34 pages).
PCT/US2007/69816: International Search Report and Written Opinion of the International Searching Authority.
Int'l Preliminary Report On Patentability, PCT application PCT/US/2007/069816 (Jan. 22, 2009), 7 pages.

* cited by examiner

*Primary Examiner*—Vinh P Nguyen
(74) *Attorney, Agent, or Firm*—N. Kenneth Burraston

(57) ABSTRACT

A composite substrate for testing semiconductor devices is formed by selecting a plurality of substantially identical individual substrates, cutting a corner from at least some of the individual substrates in accordance with their position in a final array configuration, and then assembling the individual substrates into the final array configuration. The final array configuration of substrates with corners cut or sawed away conforms more closely to the surface area of a wafer being tested, and can easily fit within space limits of a test environment.

13 Claims, 8 Drawing Sheets

SAWING TILE CORNERS ON PROBE CARD SUBSTRATES

BACKGROUND

1. Technical Field

Embodiments of the present invention relate to components used to test integrated circuit devices under test (DUTs). More particularly, embodiments of the present invention relate to the manufacture of substrates used in an array of substrates in a probe card assembly to test the DUTs.

2. Related Art

Test systems to test DUTs can include a prober, or other test device that support a probe card for electrically contacting DUTs on the wafer. The test system for wafers can likewise be used to perform testing of DUTs after a wafer has been diced up into individual components.

The prober or other test system for supporting a probe card is typically designed to fit into a limited space requirement, and to accommodate certain size wafers. Limits to the prober and test system limit the size of a probe card to enable it to fit within the confines of the test system.

Probe card configurations can be provided to support one or more substrates or tiles carrying test probes. It is desirable to provide substrates themselves that fit within the confines of the area of a prober or other test device for supporting probe cards while providing a substrate that is simple and inexpensive to manufacture.

SUMMARY

According to some embodiments of the present invention, substrates used in testing semiconductor devices are manufactured to enable a single substrate, or multiple substrates as arranged in an array to fit within an area substantially similar to the surface area of a wafer. This enables the substrates to easily fit within the confines of a prober loading and docking mechanism or limited test environment. The method of manufacture of the substrates further enables substantially identical substrates to be initially formed in a cost effective production process, with slight alterations to some substrates after manufacture to enable the substrates, especially when placed in the array, to fit within a limited area.

In some embodiments of the present invention, a composite substrate for testing semiconductor devices is formed by: selecting a plurality of substantially identical individual substrates; removing a portion from at least some of the individual substrates in accordance with their position in a final array configuration; and assembling the individual substrates into the final configuration.

The individual substrates can be created with this removal in mind so that removal of the portion does not break certain internal connections. The individual substrates can be identical in the sense that their peripheral shape and size before cutting is substantially the same. The individual substrates can further be identical in the sense that their internal connections and probes that they support are also the same. The portions removed, in some embodiments are removed by sawing off a corner of the substrates along a saw mark provided on the substrates during manufacture. As an alternative to sawing, a corner can be removed by a chemical etching or other process. In addition to a saw mark, marking on the substrate can be provided to identify which corner was removed after the sawing occurs. The probes supported by the substrates can be resilient springs or other electric contacts that are formed integrally with the substrate, or later attached to the substrates either before or after corners have been cut away.

In some embodiments the substrate tiles supporting probes can be cut to match the peripheral size and shape of a single DUT. With particularly complex DUTs, a single test tile for each DUT can be beneficial to increase yield of the test tile substrates, as opposed to a single test substrate with circuitry to test multiple DUTs. The single DUT test substrate can likewise be cut to fit into the confines of the DUT die holding mechanism after the DUT has been diced up from an original wafer.

BRIEF DESCRIPTION OF THE DRAWINGS

Further details of the present invention are explained with the help of the attached drawings in which.

DETAILED DESCRIPTION

Figure 1:
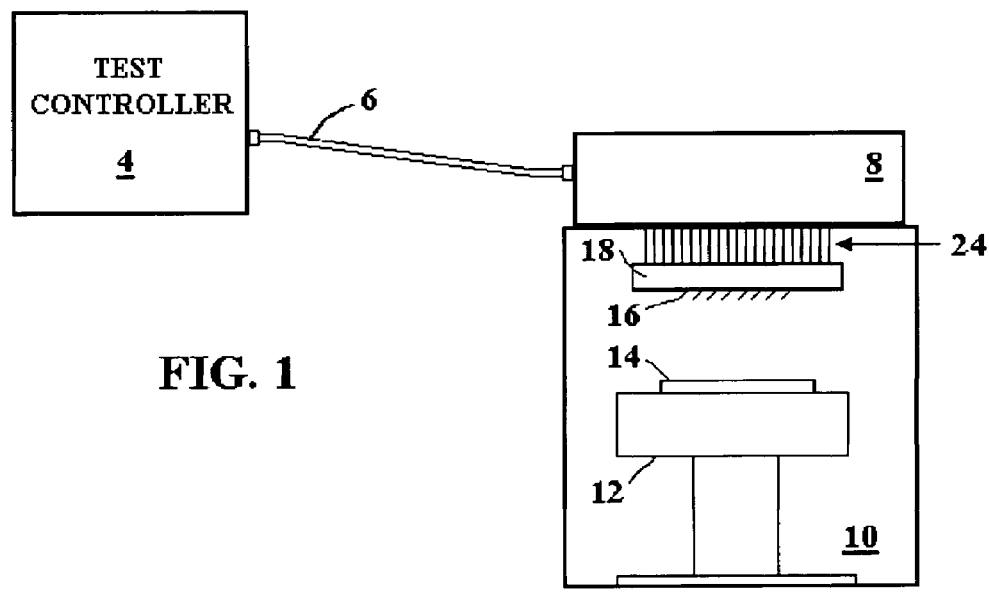
FIG. 1 shows a block diagram of a conventional test system.

FIG. 1 shows a block diagram of a conventional test system using a prober 10 supporting a probe card 18 for testing DUTs on a semiconductor wafer. The test system includes a test controller 4 connected by a communication cable 6 to a test head 8. The prober 10 is made up of a stage 12 for mounting a wafer 14 being tested, the stage 12 being movable to contact the wafer 14 with probes 16 on a probe card 18.

In the test system, test data is generated by the test controller 4 and transmitted through the communication cable 6, test head 8, probe card 18, probes 16 and ultimately to DUTs on the wafer 14. Test results are then provided from DUTs on the wafer back through the probe card 18 to the test head 8 for transmission back to the test controller 4. The probe card 18 can also be used to test DUTs that have been singulated from a wafer.

Test data provided from the test controller 4 is divided into the individual tester channels provided through the cable 6 and separated in the test head 8 so that each channel is carried to at least one of the probes 16. The channels from the test head 8 are linked by connectors 24 to the probe card 18. The probe card 18 then links the test head to the wafer. The probe card 18 can include one or more substrates that support the probes 16.

Figure 2:
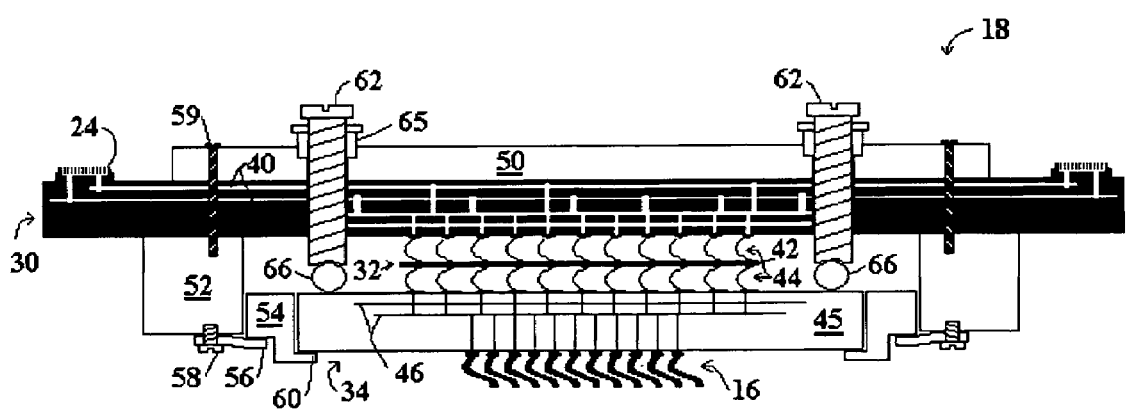
FIG. 2 shows a cross sectional view of components of a conventional probe card.

FIG. 2 shows a cross sectional view of components of a conventional probe card 18 that supports a single substrate 45 with probes 16. The probe card 18 is configured to provide both electrical pathways and mechanical support for the spring probes 16 that will directly contact the DUTs. The probe card 18 electrical pathways can be provided through a printed circuit board (PCB) 30, an interposer 32, and a space transformer 34. Test data from the test head 8 can be provided through pogo pins or zero insertion force (ZIF) connectors 24 typically connected around the periphery of the PCB 30. Channel transmission lines 40 can distribute signals from the tester interface connectors (pogo or ZIF) 24 horizontally and vertically in the PCB 30 to contact pads on the PCB 30 to match the routing pitch of pads on the space transformer 34. The interposer 32 can include a substrate 42 with spring probe electrical contacts 44 disposed on both sides. The interposer 32 electrically connects individual pads on the PCB 30 to electrical contact pads on the space transformer 34. Transmission lines 46 in a substrate 45 of the space transformer 34 distribute or "space transform" signal lines to the probes 16. The space transformer substrate 45 can be constructed from either multi-layered ceramic or organic based laminates.

Mechanical support for the electrical components can be provided by a back plate 50, bracket 52, frame 54, leaf springs 56, and leveling pins 62. The back plate 50 can be provided on one side of the PCB 30, while the bracket 52 is provided on the other side and attached by screws 59. The leaf springs 56 can be attached by screws 58 to the bracket 52. The leaf springs 56 extend to movably hold the frame 54 within the interior walls of the bracket 52. The frame 54 can include horizontal extensions 60 for supporting the space transformer 34 within its interior walls. The frame 54 can surround the probe head and maintain a close tolerance to the bracket 52 such that lateral motion is limited.

Leveling pins 62 can provide mechanical support for the electrical components and provide for leveling of the space transformer 34. The leveling pins 62 can be adjusted so that brass spheres 66 provide a point contact with the space transformer 34. Leveling of the substrate can be accomplished by precise adjustment of these spheres through the use of advancing screws 62, referred to as the leveling pins. Leveling pins 62 are adjustable to level the space transformer 34. The leveling pins 62 are screwed through supports 65 in the back plate 50.

Figure 3:
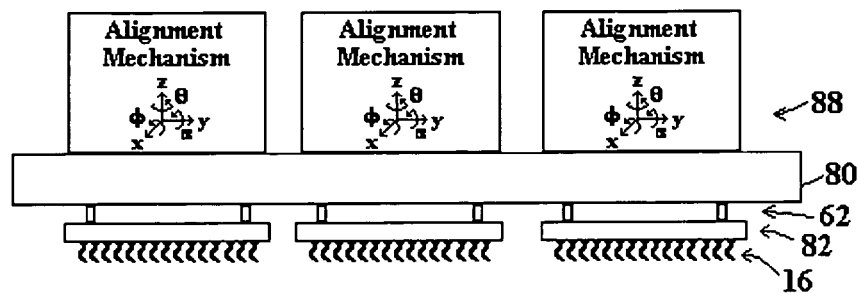
FIG. 3 shows an alternative prove card assembly with multiple tiled substrates supported together in an array.

FIG. 3 shows an alternative prove card assembly wherein multiple tiled substrates are supported together in an array for testing. The structure shown includes a stiffener 80 supporting the multiple tile substrates 82. The substrate tiles 82 can be included with a segmented PCB, or a PCB can be provided as a single unit in combination with the stiffener 80. Leveling pins 62 screwed through the stiffener 80 are provided to level the probe support substrates 82 relative to a wafer. Alignment mechanisms 88 are provided for adjusting the position of tiles 82 using leveling pins 62, the alignment mechanisms 88 providing up to six degrees of motion $\{x, y, z, \alpha, \theta, \phi\}$ separately for each tile.

Specific examples of probe card assemblies for FIG. 3 that support multiple probe substrates are described in U.S. patent application Ser. No. 10/868,425, entitled "Mechanically Reconfigurable Vertical Tester Interface For IC Probing," by Eldridge, et al., filed Dec. 15, 2005. One example uses the support structure of FIG. 2 replicated a number of times with a common interconnecting back plates 50 to provide an array of the space transformers 45. An alternative to using multiple support structures of FIG. 2, is the structure shown in FIG. 4, which provides for closer spacing between separate substrate tiles $45_1$ and $45_2$ for a multiple substrate tile array.

Figure 4:
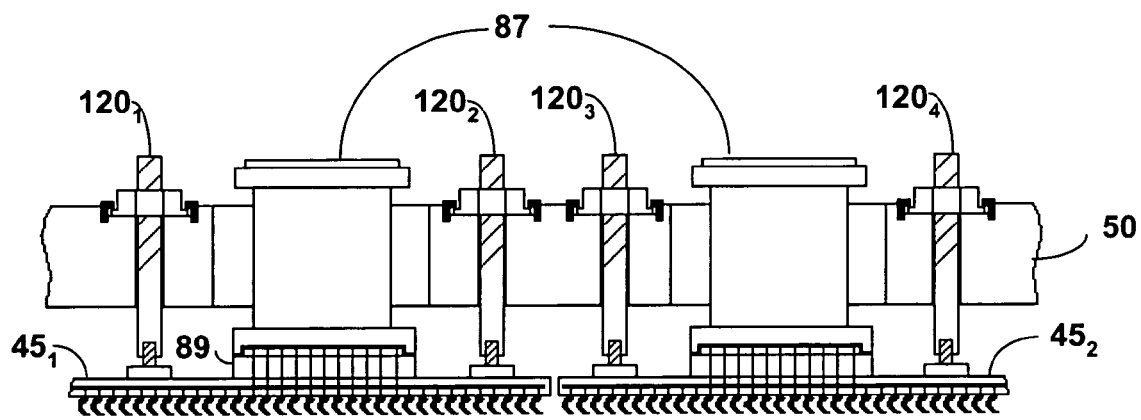
FIG. 4 shows details of one configuration for the probe card assembly shown in FIG. 3.

As described in U.S. patent application Ser. No. 10/868, 425, referenced previously, the configuration of FIG. 4 uses flexible cable connectors 87, enabling elimination of an interposer 32 and the PCB 30 of FIG. 2. In FIG. 4 the probe card assembly is made up of substrates $45_1$ and $45_2$ supporting probes 16 on one side, and one or more connectors 87 on the other side for connecting to a flexible cable connector 89. The other end of the flexible cable connector 89 in FIG. 4 can either mate directly to a corresponding connector of a test head (not shown). The leveling and support mechanism shown includes leveling pins $120_1$-$120_4$. Components for leveling and support attached to leveling pins $120_1$-$120_4$ are illustrated allowing for movement of the substrates $45_1$ and $45_2$ in all of the adjustment planes z, $\alpha$, and $\phi$. Although the tile support mechanism of FIG. 4 is illustrated for use with multiple substrate tiles $45_1$ and $45_2$, this support mechanism can be provided with a probe card having only one tile.

Figure 5:
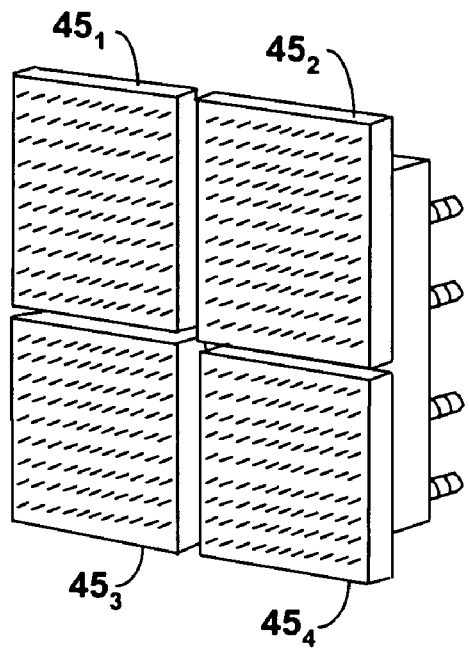
FIG. 5 shows a perspective view of multiple tiled substrates supported together in an array on a probe card.

FIG. 5 shows a perspective view with an array of four substrates $45_1$-$45_4$ mounted on a support forming a probe card illustrating how substrate tiles made according to embodiments of the present invention can be supported. Although shown with a support for the substrates as illustrated by FIG. 4, other support or mount configurations for the substrate tiles can be used to mount substrates manufactured according to some embodiments of the present invention. Non-limiting examples of substrate support mechanisms include the support shown in FIG. 2, other mechanisms as illustrated in U.S. patent application Ser. No. 10/868,425, referenced previously, or other substrate mount configurations known in the art. Although substrate tiles are referred to, it is understood that tiles or substrates referenced include substrates with one or more layers of material that can support compliant interconnects, and that can be cut after manufacture.

Figure 6:
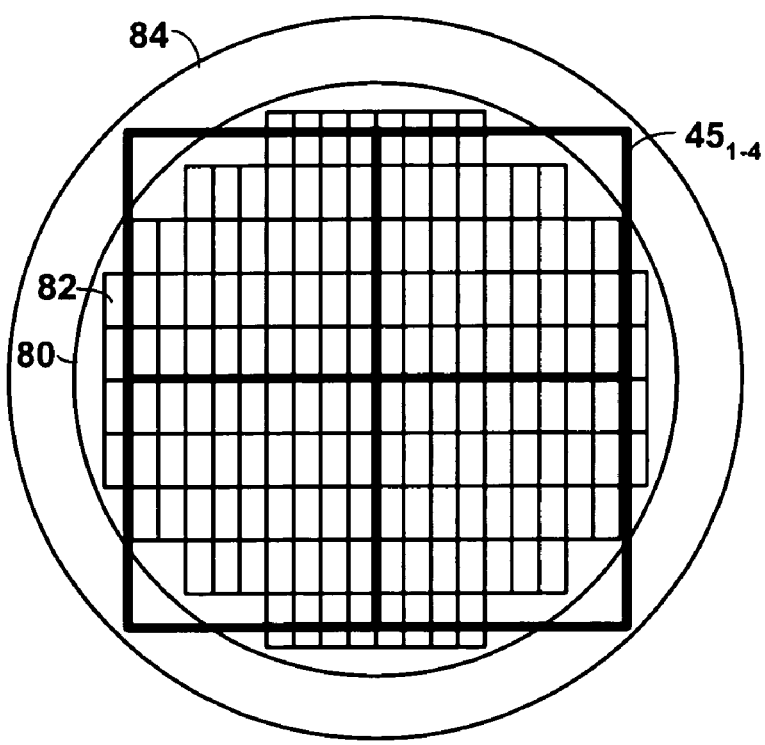
FIG. 6 illustrates placement of the tiled substrates of the probe card of FIG. 5 over a wafer for testing.

FIG. 6 illustrates the peripheral outline of the array of substrates $45_1$-$45_4$ of FIG. 5 as placed over a wafer 80 to test DUTs 82 formed on the wafer 80. Note that the periphery of substrates $45_1$-$45_4$ does not extend over all of the DUTs 82, preventing testing of all the DUTs at one time.

Figure 7:
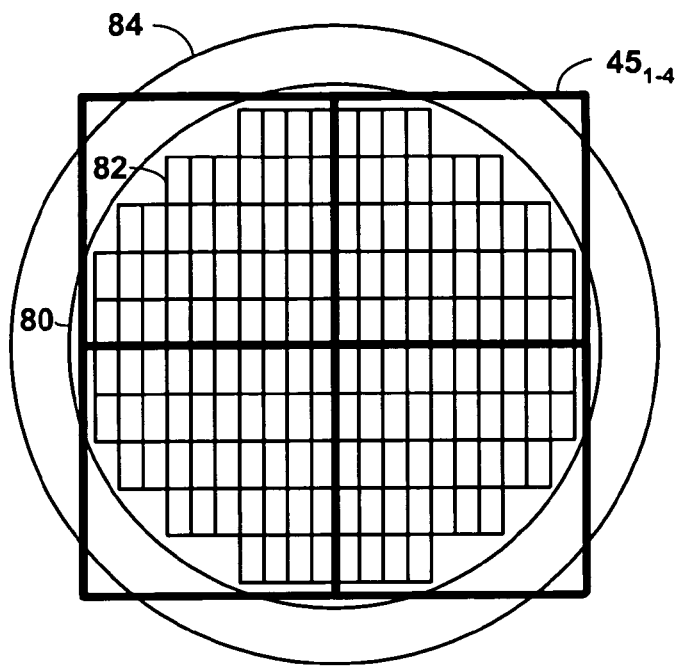
FIG. 7 illustrates placement of the probe card of FIG. 5 over a wafer for testing, wherein the peripheral size and shape of the array of substrates is greater than limits of a test environment.

FIG. 7 illustrates increasing the peripheral limits of the array of substrates $45_1$-$45_4$ to accommodate testing of all DUTs 80 on the substrate 82 during a single touchdown. However, the peripheral bounds of the substrates $45_1$-$45_4$ extend beyond the limits 84 for the test environment. The test environment limits 84 can be set by the size of a prober, limits of a prober loading and docking mechanism, limits of the size of the mechanism for supporting substrates, or simply limits of the test environment itself. Recognizing the limits of the confines of a test environment where the substrates are used, embodiments of the present invention are provided to enable substrates to be manufactured to test all DUTs on a wafer, while remaining within confined boundaries close to the peripheral boundaries of the wafer.

Figure 8:
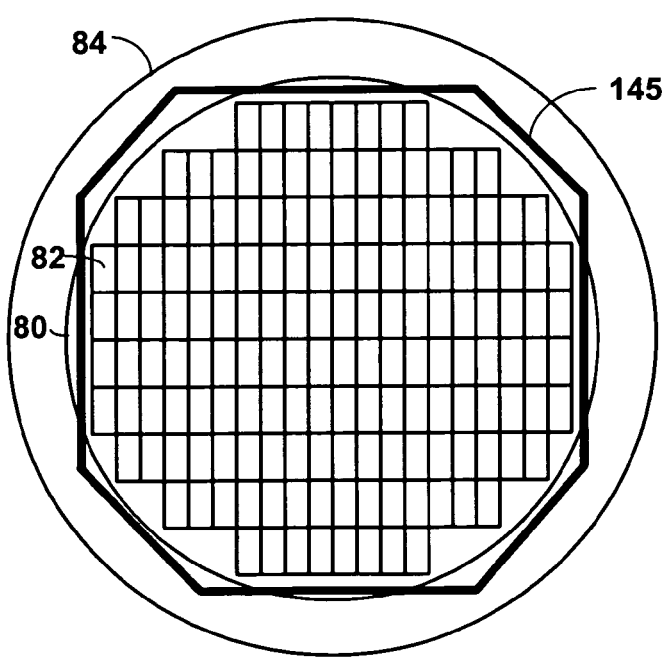
FIG. 8 shows the peripheral edges of a substrate made according to some embodiments of the present invention as placed over a wafer for testing.

FIG. 8 illustrates how a single substrate 145 according to some embodiments of the present invention has a periphery maintained within the limits 84 of the prober or test environment, yet the substrate extends sufficiently to cover all DUTs 82 on a wafer 80. The single substrate 145 with a periphery illustrated in FIG. 8 is manufactured according to some embodiments of the present invention by removing corners from a square or rectangular substrate. The corners can be removed by sawing, laser cutting, etching, or other methods known in the art. Note that although the confines or limits 84 of the prober or test equipment are illustrated, other design limits may dictate the necessity to remove a corner of the substrate.

Figure 9:
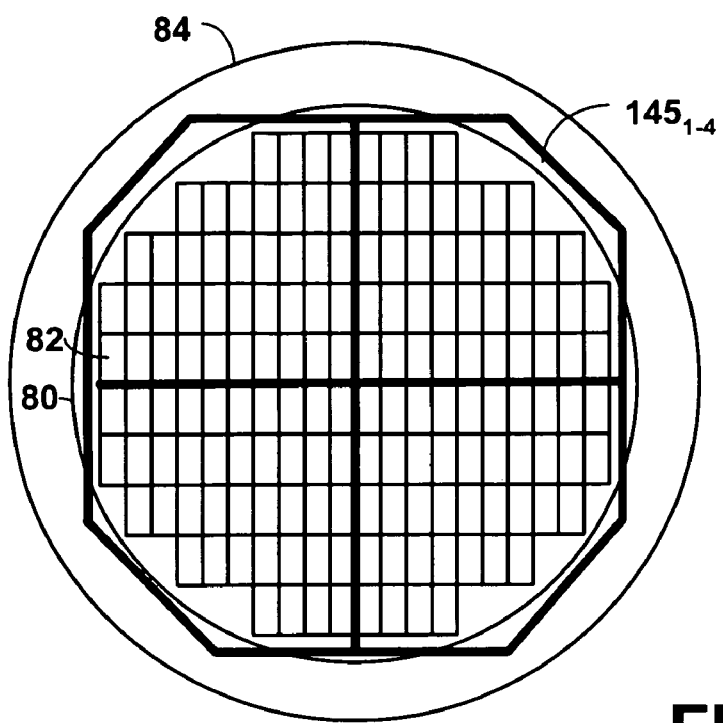
FIG. 9 shows the peripheral edges of four substrates in an array of substrates made according to some embodiment of the present invention as placed over a wafer for testing.

FIG. 9 illustrates how multiple substrates $145_{1-4}$ in an array can be manufactured according to some embodiments of the present invention to test all DUTs 82. In FIG. 9 the peripheral boundary of the four substrates $145_{1-4}$ manufactured according to some embodiments of the present invention remain within the limits 84 of a test environment. The four substrates $145_{1-4}$ are originally manufactured as rectangular or square substrates, and then one corner is removed. A corner can removed by sawing, laser cutting, etching, or other procedure known in the art, as with the multiple corners of the single substrate of FIG. 8. As with the arrangement of FIG. 8, the four substrates $145_{1-4}$ of FIG. 9 have a periphery within the limits 84 of a test environment after corners are removed and the substrates can be arranged in a final array configuration, yet the array of substrates extends sufficiently to cover all DUTs 82 on a wafer 80.

Figure 10:
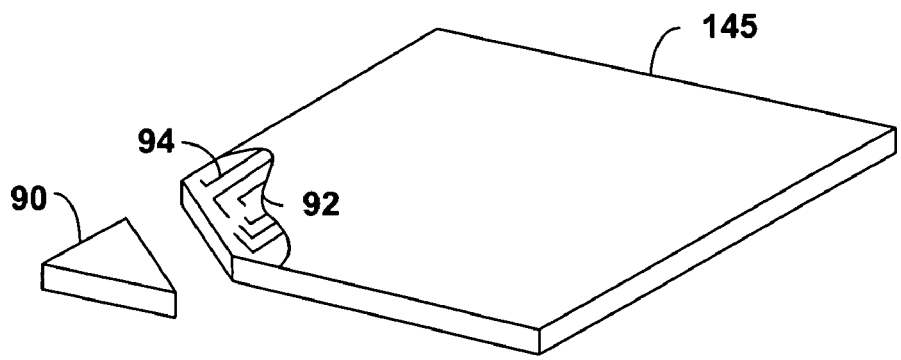
FIG. 10 shows a perspective view of a substrate illustrating a substrate manufactured according to some embodiments of the present invention.

FIG. 10 shows a perspective view of a substrate 145 illustrating how the substrates of the array of FIG. 9 are manufactured according to some embodiments of the present invention. The substrate 145 can be manufactured as a rectangular or square. After manufacturing steps for the rectangular or square substrate 145, a corner 90 is cut off. The corner 90 can be cut by sawing, by laser cutting, by chemical etching, or by other similar processes known in the art. As illustrated in FIG. 10, the internal routing traces 94 (shown in the cut away section 92 of the substrate 145) can be arranged during manufacture so that when the substrate 145 is cut, the routing traces 94 are not disturbed.

The substrates of the array of FIG. 9 prior to cutting a corner, as illustrated in FIG. 10, can be made substantially identical. The substantially identical substrates can be manufactured for replacement tiles, with a corner being cut only when it is determined which tile it will replace. In one embodiment, the peripheral boundary shape and size of the four substrates $145_{1-4}$ of FIG. 9 is identical before a corner is removed. In a further embodiment, both the peripheral boundary shape and size and the configuration of internal routing traces of the four substrates are identical before a corner is removed.

In the array configuration of FIG. 9, testing can be performed and failed substrates can be eliminated. With identical substrates before corners are cut, only one type of replacement substrate is needed, unlike when a different replacement substrate must be manufactured for each tile $145_{1-4}$. With only one type of replacement substrate needed, although different corners may be cut, overall production costs can be reduced. Substrates can also be binned based on a defect location. If the defect does not lie in a corner that can be sawn off, it may be necessary to either repair the defect or scrap the substrate. After manufacture and replacement of failed substrates, the substrates $145_{1-4}$ of FIG. 9 can be mounted in a final array configuration on a probe card. The additional substrates manufactured for replacement purposes can have a corner cut to replace a defective substrate only after it is determine which substrate failed to identify the corner to cut. A defective or damaged substrate tile can later be repaired and used in subsequent arrays.

Figure 11:
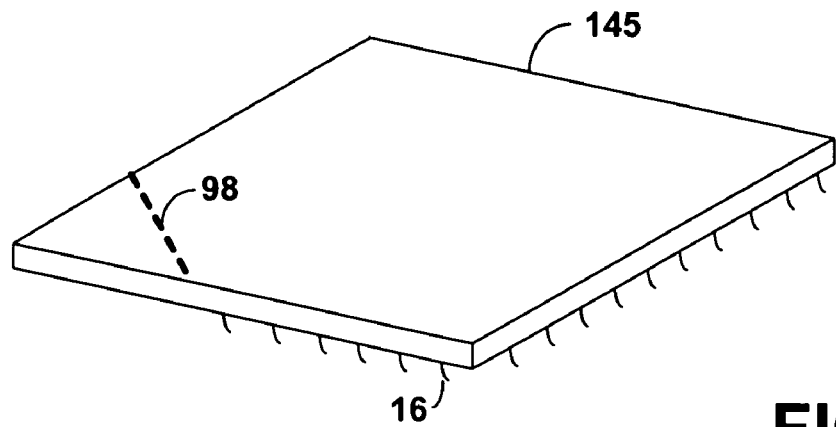
FIG. 11 shows a perspective view of a substrate illustrating a marking provided on the substrate for manufacture according to some embodiments of the present invention.

FIG. 11 shows a further perspective view of a substrate 145 illustrating a marking 98 provided on the substrate according to some embodiments of the present invention. The marking 98 can be a deposited material, such as a metal region, an etched line or other structure interference features provided on the substrate during or after manufacture. In one embodiment, spring tips are used as reference mark features for a cutting line. The marking 98 provides for alignment of a cutting tool.

FIG. 11 further illustrates that the substrate 145 shown can support probes 16. The probes 16 can be manufactured as part of the substrate prior to cutting. Alternatively, the probes can be attached to electrical contacts on the substrate after a corner is cut away. The probes 16 can be resilient spring probes manufactured using a resilient plated wire. Alternatively, the probes 16 can be resilient spring members manufactured using lithographic processing. The lithographically formed probes can be formed integrally with the substrate, or formed separately and later attached. Other probe structures such as conductive bumps or wires providing for electrical contact can likewise be use with the substrates manufactured according to some embodiments of the present invention.

Figure 12:
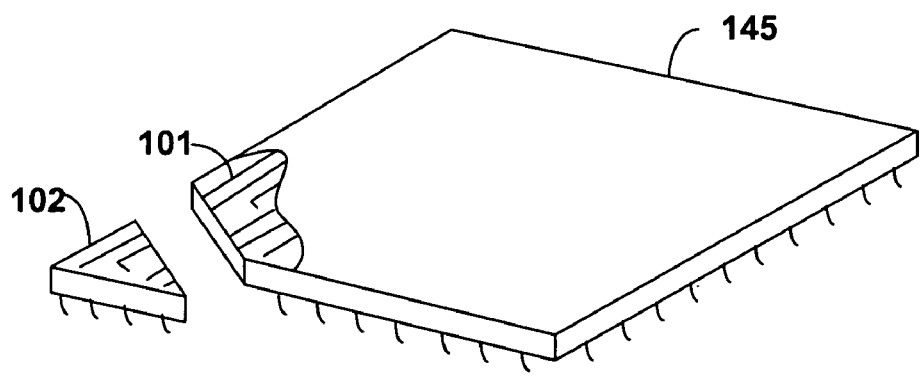
FIG. 12 shows a perspective view of a substrate illustrating a substrate when internal traces extend through saw lines according to some embodiments of the present invention.

FIG. 12 shows a perspective view of a substrate illustrating manufacture of a substrate when internal traces extend through saw lines according to some embodiments of the present invention. The substrate 145 is initially manufactured as a rectangular or square with internal lines 101 that extend into a corner 102 that can be cut off. Although the lines are cut, a design for the substrate predicting that the lines can be cut provide for isolation of the lines. For example, the lines can connect to probes on the cut away portion 102 that are simply not used. Alternatively, grounding of the lines can be provided in the test set up to prevent charge buildup on the lines to isolate the lines from other lines. Further, buffering material can be provided between the lines that can be cut and other lines in the substrate tile 145.

Figure 13:
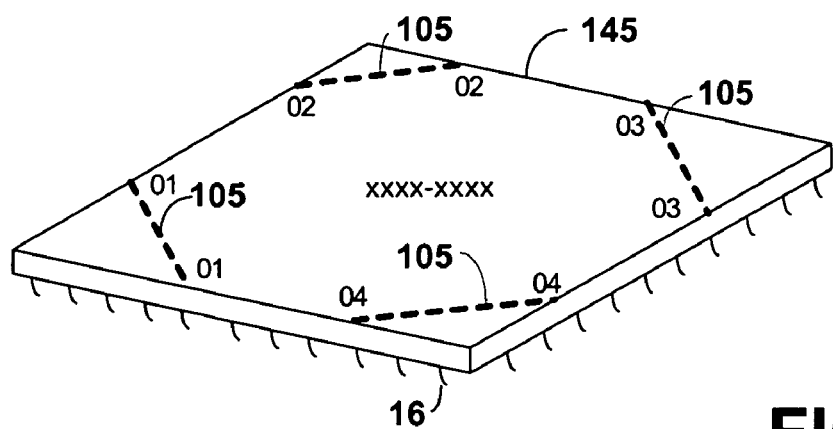
FIG. 13 shows a perspective view of a substrate illustrating an alternative marking for manufacture and substrate identification according to some embodiments of the present invention.

FIG. 13 shows a perspective view of a substrate illustrating an alternative marking for manufacture and substrate identification according to some embodiments of the present invention. The marking 105 can be a deposited material, such as a metal region, an etched line or other structure provided on the substrate during or after manufacture as described with respect to FIG. 11. Markings can be provided on all four corners of FIG. 13, since it is anticipated that internal traces can be cut that extend into the corners as illustrated in FIG. 12. The markings enable only certain predicted lines (if any) that are cut to be identified. Since internal traces extend into the corners that can be cut, probes 16 are shown extending from the corners that may be cut away, wherein the cut away probes 16 can connect to the internal traces.

FIG. 13 further illustrates that the markings can include identification numbers such as "01," "02," "03," and "04" to identify the corner cut in some embodiments. In one embodiment, the serial number assigned to the tile can be identified with the marking number "xxxx-xxxx" shown. With identification of the serial number for inventory purposes using the number "xxxx-xxxx," a two digit addition of "01," "02," etc.

can be added to the indentification number to indicate which corner is later cut away from the tile.

Figure 14:
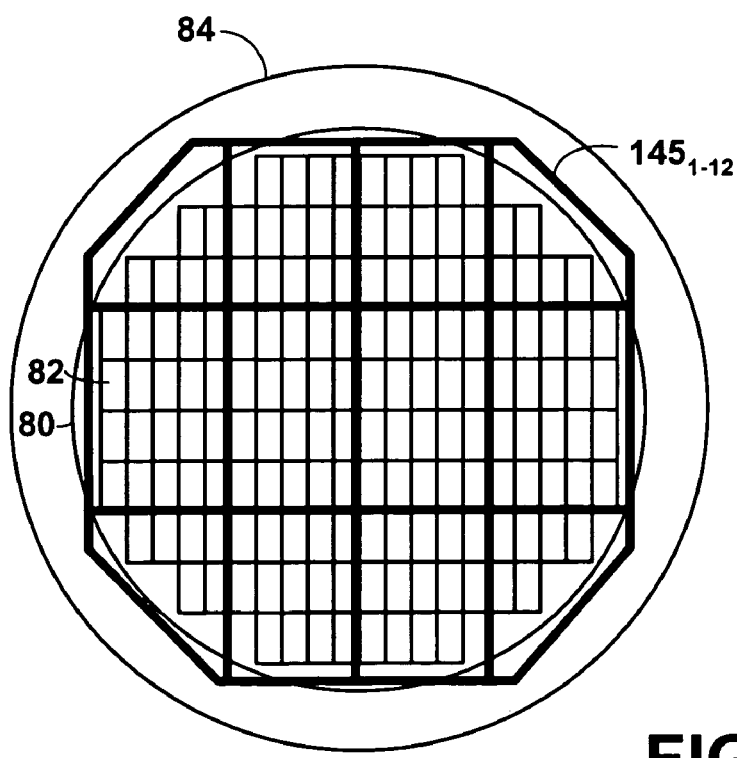
FIG. 14 shows the peripheral edges of twelve substrates in an array of substrates made according to some embodiment of the present invention as placed over a wafer for testing.

FIG. 14 shows the peripheral edges of twelve substrate tiles $145_{1-12}$ in an array of substrates made according to some embodiments of the present invention as placed over a wafer 80 for testing. FIG. 14, in combination with FIGS. 8 and 9 illustrates that any number of substrates can be manufactured and arranged individually or in an array in accordance with embodiments of the present invention. Although corners are cut from all the substrate tiles of FIGS. 8 and 9, FIG. 14 illustrates that not all substrates may require corners to be removed to fit within a desired area 84 and allow for testing of all DUTs 82 on the wafer 80. Although a wafer 80 area is indicated, it is understood that DUTs can be diced up from an wafer and rearranged in the area 80 for testing, such as in a burn in test with substrates $145_{1-12}$ made according to some embodiments of the present invention used during the test process.

Figure 15:
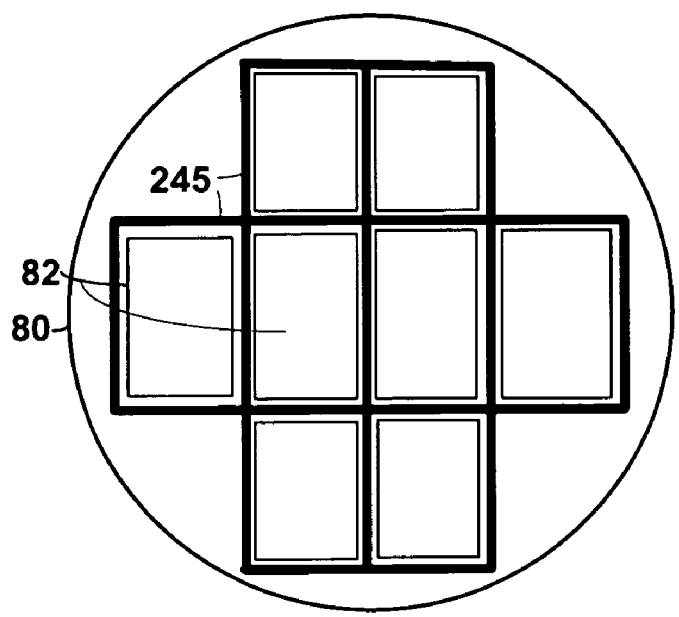
FIG. 15 shows tiles made to substantially match the size of a DUT according to some embodiments of the present invention.

FIG. 15 illustrates that the tiles 245 can be made to substantially match the size of a DUTs 82 on a wafer 80 according to some embodiments of the present invention. The tiles 245 are shown slightly larger than the DUTs 82 to enable both components to be seen in FIG. 15 drawing, although the tiles can be made slightly larger or slightly smaller than the DUTs 82 to accommodate space available in a particular test system design. The tiles 245 made to substantially match the DUT may be particularly beneficial for complex DUTs that occupy a substantial portion of the wafer and require complex internal traces, since the manufacturing yield of individual test tiles may be significantly higher than with multiple test tiles combined onto a single substrate. Although the test tiles 245 are shown abutted together in FIG. 15, as well as in previous figures herein, it is understood that a separation gap of any desired size can be provided between the tiles.

Figure 16:
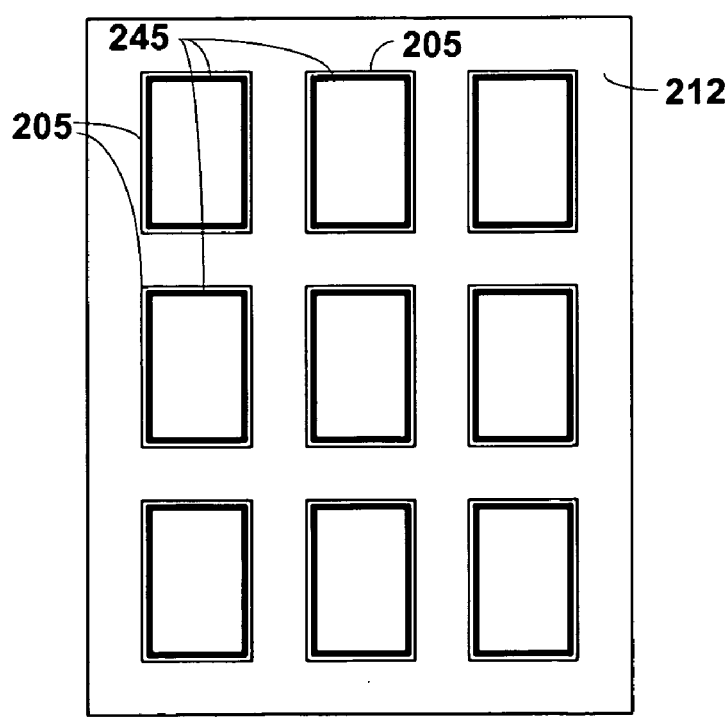
FIG. 16 shows tiles made to substantially match the size of a DUT to enable the tile to fit within a recess where a DUT is held according to some embodiments of the present invention.

FIG. 16 shows that the tiles 245 made to substantially match the size of a DUT can enable the tile to fit within a recess 205 where a DUT is held on a plate 212 according to some embodiments of the present invention. In FIG. 16 it is assumed that the DUTs have been diced up from the wafer and stored in recesses 205 of a holding plate 212. Alternatively, the plate 212 can be flat and the DUTs can be held in place by an adhesive, by a vacuum applied through openings in the plate 212, or by other means such as electrostatic force or compressive forces. With or without the recesses, a single tile could be used with probes extending to test all of the DUTs together. However, as indicated with respect to FIG. 15, with complex DUTs, it may be beneficial to manufacture one test tile per DUT to improve yields. A single test tile per DUT can likewise be desirable to accommodate the tile support or mounting mechanism. Further, as described with respect to FIG. 15, the tiles can be manufactured to match the DUT peripheral boundary size and shape, or the tile can be made slightly larger or slightly smaller than the DUT.

Although embodiments of the present invention have been described above with particularity, this was merely to teach one of ordinary skill in the art how to make and use the invention. Many additional modifications will fall within the scope of the invention, as that scope is defined by the following claims.

What is claimed is:

1. A probe card assembly for testing a semiconductor wafer comprising:
 a plurality of individual substrates each comprising a plurality of probes configured to contact dies of the semiconductor wafer and first electrically conductive internal paths connected to the probes, the individual substrates arranged in an away having an outer perimeter;
 an electrical interface connectable to a tester configured to control testing of the dies; and
 electrical connections between the electrical interface and the first electrically conductive internal paths of the individual substrate,
 wherein at least one of the individual substrates has a shape that comprises three approximately ninety degree angles and two obtuse angles, and a first edge of the individual substrate between the two obtuse angles is part of the outer perimeter of the array,
 wherein the first edge comprises a cut line wherein ones of the first electrically conductive internal paths are spaced apart from the cut line, and
 wherein a second plurality of electrically conductive internal paths are not connected to the probes and extend to the cut line.

2. The probe card of claim 1, wherein each of the at least one of the individual substrates has a second edge between one of the obtuse angles and a first one of the approximately ninety degree angles, a third edge between the first one of the approximately ninety degree angles and a second one of the approximately ninety degree angles, a fourth edge between the second one of the approximately ninety degree angles and a third one of the approximately ninety degree angles, and a fifth edge between the third one of the approximately ninety degree angles and another of the obtuse angles.

3. The probe card of claim 1, further comprising:
 a support fixture for holding the individual substrates, wherein the first edge of each of the at least one individual substrates between the two obtuse angles is part of the outer periphery of the array.

4. The probe card of claim 1, further comprising:
 a support structure for holding the individual substrates in the array.

5. The probe card of claim 4, wherein:
 the outer perimeter is an octagon shape, the octagon shape being a square or rectangular shape with four missing corners, and
 the octagon shape fits into a generally round predetermined area that the square or rectangular shape would not fit into.

6. The probe card of claim 5, wherein the predetermined area is a surface area of the wafer.

7. The probe card of claim 5, further comprising:
 a prober for holding the support structure, the prober having an opening through which the array of the individual substrates pass, wherein the predetermined area is an area of the opening.

8. The probe card of claim 1, wherein the probes comprise lithographically formed compliant contacts.

9. A probe substrate for use in a probe card assembly for testing a semiconductor wafer comprising:
 a substrate;
 a plurality of probes disposed on the substrate and configured to contact dies of the semiconductor wafer;
 a cut line extending from a first edge of the substrate to a second edge of the substrate, the cut line defining a removable corner of the probe substrate;
 a plurality of electrically conductive internal traces disposed in the substrate and connected to the plurality of probes;
 wherein first ones of the plurality of electrically conductive internal traces are connected to ones of the plurality of probes disposed within the removable corner and the first ones of the plurality of electrically conductive internal traces cross the cut line; and wherein second ones of the plurality of electrically conductive internal traces are connected to ones of the plurality of probes not disposed within the removable corner and the second ones of the plurality of electrically conductive internal traces do not cross the cut line.

10. The probe substrate of claim 9, further comprising:

a second cut line extending from a third edge to a fourth edge of the substrate, the cut line defining a second removable corner of the probe substrate;

wherein third ones of the plurality of electrically conductive internal traces are connected to ones of the plurality of probes disposed within the second removable corner and the third ones of the plurality of electrically conductive internal traces cross the second cut line; and wherein four ones of the plurality of electrically conductive internal traces are connected to ones of the plurality of probes not disposed within the second removable corner and the fourth ones of the plurality of electrically conductive internal traces do not cross the second cut line.

11. The probe substrate of claim 9, further comprising a marking disposed along the cut line.

12. The probe substrate of claim 9, wherein the removable corner is detached at the cut line.

13. The probe substrate of claim 9, wherein the probes comprise lithographically formed compliant contacts.

* * * * *